United States Patent
Schneiderwind

(10) Patent No.: US 7,925,814 B2
(45) Date of Patent: Apr. 12, 2011

(54) DYNAMICALLY CONFIGURABLE HIGH SPEED INTERCONNECT USING A NONLINEAR ELEMENT

(75) Inventor: Robert A. Schneiderwind, Castle Rock, CO (US)

(73) Assignee: Chaologix, Inc., Gainesville, FL (US)

( * ) Notice: Subject to any disclaimer, the term of this patent is extended or adjusted under 35 U.S.C. 154(b) by 0 days.

(21) Appl. No.: 12/599,206

(22) PCT Filed: May 8, 2008

(86) PCT No.: PCT/US2008/063085
§ 371 (c)(1),
(2), (4) Date: Nov. 6, 2009

(87) PCT Pub. No.: WO2008/141098
PCT Pub. Date: Nov. 20, 2008

(65) Prior Publication Data
US 2011/0006807 A1    Jan. 13, 2011

Related U.S. Application Data

(60) Provisional application No. 60/916,959, filed on May 9, 2007.

(51) Int. Cl.
G06F 13/36 (2006.01)
H03K 19/177 (2006.01)
(52) U.S. Cl. .......... 710/313; 710/314; 710/315; 710/71; 326/41
(58) Field of Classification Search .............. 326/37–41; 710/71, 313–315; 716/1, 2
See application file for complete search history.

(56) References Cited

U.S. PATENT DOCUMENTS

| 6,066,961 | A | 5/2000 | Lee et al. |
| 6,466,051 | B1 | 10/2002 | Jones et al. |
| 6,708,191 | B2 | 3/2004 | Chapman et al. |
| 7,096,437 | B2* | 8/2006 | Ditto et al. ........... 326/38 |
| 7,415,683 | B2* | 8/2008 | Ditto et al. .......... 716/132 |
| 7,453,285 | B2* | 11/2008 | Kiel et al. ........... 326/38 |
| 7,519,747 | B1* | 4/2009 | Cory et al. .......... 710/53 |
| 7,765,382 | B2* | 7/2010 | Chester ............. 712/15 |
| 2008/0250225 | A1* | 10/2008 | Chester ............. 712/15 |
| 2010/0219858 | A1* | 9/2010 | Ditto et al. ........... 326/37 |

OTHER PUBLICATIONS

International Search Report and Written Opinion mailed Dec. 3, 2008, PCT/US2008/063085.
Murali, et al., "Chaos computing: experimental realization of NOR gate using a simple chaotic circuit," Physics Letters A, vol. 339, pp. 39-44, Mar. 8, 2005.
Murali, et al., "Experimental realization of chaos control by thresholding," Physical Review E., vol. 68, Jul. 14, 2003.

* cited by examiner

*Primary Examiner* — Vibol Tan
(74) *Attorney, Agent, or Firm* — Jon A. Gibbons; Fleit Gibbons Gutman Bongini & Bianco PL

(57) ABSTRACT

A dynamically configurable logic gate includes an input summer for receiving a first input signal and a second input signal to generate a summed input signal. Further the dynamically configurable logic gate includes a nonlinear element that applies a nonlinear function to the summed input signal to produce a nonlinear output signal. The dynamically configurable logic gate output signal corresponds to one of a plurality of different logic gates responsive to adjusting the summed input signal and/or the nonlinear function. In another embodiment, the dynamically configurable logic gate includes feedback to one of the inputs. The dynamically configurable logic gate receives the two inputs and operates as one of a plurality of different logic gate types so as to produce an output signal that corresponds to a memory latch according to a selection of the control signal. An array structure of dynamically configurable logic elements is also disclosed.

3 Claims, 15 Drawing Sheets

US 7,925,814 B2

DYNAMICALLY CONFIGURABLE HIGH SPEED INTERCONNECT USING A NONLINEAR ELEMENT

FIELD OF THE INVENTION

The present invention generally relates to the field of dynamic computing and, more particularly, to configurable computing architecture for logic gates using nonlinear elements.

BACKGROUND OF THE INVENTION

Conventional computing systems rely on static combination of logic gates to implement one or more predefined Boolean algebraic functions and/or memory. Within static computing systems, the various hardware components of the computing system cannot be reconnected or reconfigured during hardware operation. For example, the functionality of hardware components such as logic gates or memory latch cannot be dynamically changed once the component is fabricated.

Some computing modules, however, can be reconfigured to a limited degree. For example, field programmable gate arrays (FPGAs) provide a limited degree of flexibility with respect to reconfiguration. Such efforts have been limited to simply redirecting signal flows or "rewiring" devices or components such as FPGA's.

Other circuits using chaotic or nonlinear elements known as Chua's circuit implements classic chaos theory behavior. The Chua's circuit was first introduced in the early 1980s by Leon O. Chua, its ease of construction has made it an ubiquitous real-world example of a chaotic system.

Chua's circuit although easy to implement with off the shelf components, it is not feasible to manufacture using integrated circuit technology because the necessary inductors and capacitors consume too much circuit area and the large number of operational amplifiers necessitate numerous transistors. Moreover, integrated circuits based on Chua's circuit are often very difficult to control because the component values are very sensitive. Even a minor change to the component values often times cause chaotic oscillations to damp out.

In order to reduce the power of the nonlinear circuit, the analog designs need to be converted to a digital design with less static power dissipation. Both the input values and the output values need to be compatible with digital values, as well as the output from the nonlinear or chaotic function.

Moreover, a need exists for larger more complex logic built upon nonlinear functions while minimizing chip size, chip power consumption, and the complexity of the control circuitry for the reconfiguration of the nonlinear functions.

Accordingly what is needed is a method, circuit, array, and system to provide a low power implementation of a configurable logic element using a nonlinear or chaotic function.

SUMMARY OF THE INVENTION

Briefly, in accordance with the present invention disclosed, is a dynamically configurable logic gate. The dynamically configurable logic gate includes an input summer for receiving a first input signal and a second input signal to generate a summed input signal. Further the dynamically configurable logic gate includes a nonlinear element that applies a nonlinear function to the summed input signal to produce a nonlinear output signal. The dynamically configurable logic gate output signal corresponds to one of a plurality of different logic gates responsive to adjusting the summed input signal and/or the nonlinear function.

In another embodiment, disclosed is a dynamically configurable logic gate which includes two inputs, 1) a control signal, an output signal which is feedback to one or more of the inputs, 2) and a dynamically configurable logic gate. The dynamically configurable logic gate receives the two inputs and operates as one of a plurality of different logic gate types so as to produce an output signal that corresponds to a memory latch according to at least a selection of the control signal.

In still another embodiment, disclosed is an array of dynamically configurable logic elements. The array includes a one multiplexer to select a first control signal and/or a second control signal to produce a first array selection control signal. A first dynamically configurable logic element is included in the array, wherein the first logic element operates as one of a plurality of different logic element types according to the first selection control signal. Further the array includes a second dynamically configurable logic element, wherein the second logic element operates as one of a plurality of different logic element types according to at least the first selection control signal. At least one logical expression and/or a memory latch is implemented by the array of dynamically configurable logic elements altered responsive to first selection control signal.

The logical expressions implemented by the present invention include AND, NAND, OR, XOR, NOR, XNOR, NOT, ONE, and ZERO gate. When the nonlinear output signal is feedback to the input summer, an output signal that corresponds to a memory latch is produced.

The present invention offers a configurable logic element using a nonlinear or chaotic function. Lower power consumption, fewer components, and a digital and/or an analog compatible design are but a few of the advantages of the present invention.

The present invention also provides the advantage of an array of configurable logic blocks including configurable routing.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE EMBODIMENTS

Figure 1:
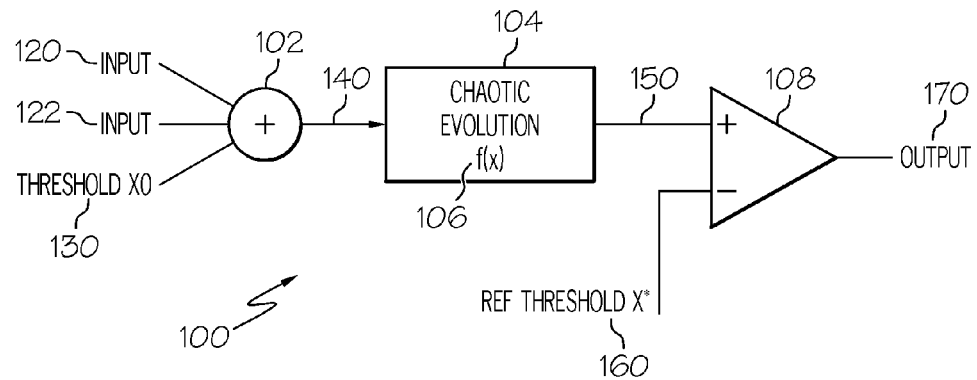
FIG. 1 is a schematic diagram illustrating one embodiment of a high level circuit architecture for a dynamically configurable logic gate, according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

This application incorporates by reference each of the following two references in their entirety: i) U.S. patent application Ser. No. 10/680,271, filed in the U.S. Patent and Trademark Office on Oct. 7, 2003, now issued as U.S. Pat. No. 7,096,437 on Aug. 22, 2006; and ii) U.S. patent application Ser. No. 11/304,125, filed in the U.S. Patent and Trademark Office on Dec. 15, 2005, now issued as U.S. Pat. No. 7,415,683.

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms nonlinear element and chaotic element and dynamical configurable element along with nonlinear function and chaotic function are used interchangeably meaning dynamical configurable logic that has a sensitive dependence on its initial conditions. The term signal, control, threshold are any electrical, magnetic, optical, biological, chemical or combination thereof to convey information to a analog or digital input.

The present invention in one embodiment is a digital implementation of a configurable logic element using a nonlinear or chaotic element. The present invention reduces the static power dissipation, reduced chip circuit area and provides inputs, outputs, and nonlinear or chaotic outputs that are compatible with digital circuit implementations. However, it should be noted that the present invention is not limited to implementation as either a digital implementation, and that analog and combinations of digital and analog circuits are within the true spirit and scope of the present invention.

Further, the present invention eliminates the feedback from the nonlinear or chaotic element. Multiple nonlinear or chaotic evolutions are not necessary, and only a single chaotic evolution is necessary between the inputs and the output threshold or control. Instead of moving the input voltages with respect to the attractors for the rising and falling edges of the chaotic function, the attractors themselves are moved to match the inputs.

In another embodiment, the present invention also provides an array of configurable logic blocks with configurable routing to build larger and more complex digital functions.

The present invention provides a chaotic logic gate method, system, and apparatus that can be configured to function as any of a variety of different logic gates such as an "and" (AND) gate, an "or" (OR) gate, an "exclusive or" (XOR) gate, and a "not" (NOT) gate. The functions of the dynamically configurable logic gate can be altered by changing one or more reference voltages provided to the gate and/or the nonlinear function of the gate itself. Accordingly, as a simplistic example a dynamically configurable logic in accordance with the inventive arrangements disclosed herein, for example, can function as one type of gate, such as an AND logic gate, and during operation be instructed to begin operating or functioning as another type of logic gate, such as an OR logic gate.

Background on Nonlinear or Chaotic Function

Table 1 below illustrates a truth table of basic operations. For example, the third column 3 of the left illustrates the function of an AND gate given inputs ($I_1,I_2$), column 4 shows the function of an OR gate given inputs ($I_1,I_2$), and column 5 shows the function of an XOR gate given inputs ($I_1,I_2$). The second portion of Table 1 illustrates the operation of a NOT gate given input I.

TABLE 1

| $I_1$ | $I_2$ | AND | OR | XOR | I | NOT |
|---|---|---|---|---|---|---|
| 0 | 0 | 0 | 0 | 0 | 0 | 1 |
| 0 | 1 | 0 | 1 | 1 | 1 | 0 |

TABLE 1-continued

| $I_1$ | $I_2$ | AND | OR | XOR | I | NOT |
|---|---|---|---|---|---|---|
| 1 | 0 | 0 | 1 | 1 | | |
| 1 | 1 | 1 | 1 | 0 | | |

A chaotic logic gate can have an initial state represented by a value of x. In accordance with the inventive arrangements disclosed herein, each of the basic logic gate operations: AND, OR, NOT and XOR, involve the following three steps:

1. Inputs $x \rightarrow x_0 + X_1 + X_2$ for the AND, OR, and XOR operations; $x \rightarrow x_0 + X$ for the NOT operation, where $x_0$ represents the initial state of the system, $X=0$ when $I=0$, and $X=\partial$ when $I=1$.

2. Chaotic update $x \rightarrow f(x)$, where $f(x)$ is a chaotic function.

3. Threshold. To obtain output Z: $z=0$ if $f(x) \leq x^*$ and $z=f(x)-x^*$ if $f(x) > x^*$, where $x^*$ is the threshold. This is interpreted as logic output 0 if $Z=0$ and logic output 1 if $z=\partial$.

According to one embodiment of the present invention, the input and output can have equivalent definitions such that one unit is the same quantity for input and output as well as for various logical operations. This requires that the constant $\partial$ assumes the same value throughout a network. Such a configuration allows the output of one chaotic module functioning as a gate to be coupled to another chaotic module, also functioning as a particular gate, to form gate arrays for implementing compounded logic operations.

Given a dynamics $f(x)$ to be used within a physical device, the values of threshold and initial state signals that satisfy the conditions derived from the truth table to be implemented must be determined. Table 2 below illustrates the necessary conditions to be satisfied by a chaotic computing element in order to implement the logical operations AND, OR, XOR, and NOT. The symmetry of inputs reduces the four conditions in the truth table illustrated in Table 1 to three distinct conditions, where rows two and three of Table I can be combined and represented by condition two in Table 2.

TABLE 2

| Operation | AND | OR | XOR | NOT |
|---|---|---|---|---|
| Condition 1 | $f(x_0) \leq x^*$ | $f(x_0) \leq x^*$ | $f(x_0) \leq x^*$ | $(x_0) - x^* = $ delta |
| Condition 2 | $f(x_0 + \partial) \leq x^*$ | $f(x_0 + \partial) - x^* = \partial$ | $f(x_0 + \partial) - x^* = \partial$ | $f(x_0 + \partial) \leq x^*$ |
| Condition 3 | $f(x_0 + 2\partial) - x^* = $ delta | $f(x_0 + 2\partial) - x^* = $ delta | $f(x_0 + 2\partial) \leq x^*$ | |

Table 3 below shows the exact solutions of the initial $x_0$ and threshold $x^*$ which satisfy the conditions in Table 2 when $f(x) = 4ax(1-x)$ with parameter $a=1$. The constant $\partial = \frac{1}{4}$ is common to both input and output and to all logical gates.

TABLE 3

| Operation | AND | OR | XOR | NOT |
|---|---|---|---|---|
| $x_0$ | 0 | 1/8 | 1/4 | 1/2 |
| $x^*$ | 3/4 | 11/16 | 3/4 | 3/4 |

First Embodiment of Dynamically Configurable Logic Gate

Turning now to FIG. 1, shown is a schematic diagram illustrating one embodiment of a high-level circuit architecture 100 for a dynamically configurable logic gate, according to the present invention. In this implementation multiple chaotic evolutions are not necessary, and only a single chaotic evolution is necessary between the input and the output threshold circuit. By implementing only a single chaotic evolution, this greatly simplified the circuit to an input summer or input adder 102, the nonlinear element or chaotic circuit 106, and an output comparator 108.

As shown in FIG. 1, the dynamically configurable logic gate includes an input summer or input adder 102. The input adder 102 receives three signals: an input first signal 120; a second input signal 122; and a first threshold signal 130. The input adder 102 combines the three signals 120, 122, and 130 to form a summed signal 140, which is the input into the nonlinear element 104. The nonlinear element 104 applies a nonlinear function 106 to the summed input signal 140 to produce a nonlinear output signal 150. A comparator 108 receives the nonlinear output signal 150 and a second threshold signal to produce the output signal 170. The nonlinear output signal 150 corresponds to one of a plurality of different logic gates responsive to adjusting the summed input signal 140 and/or the nonlinear function 106.

Figure 2:
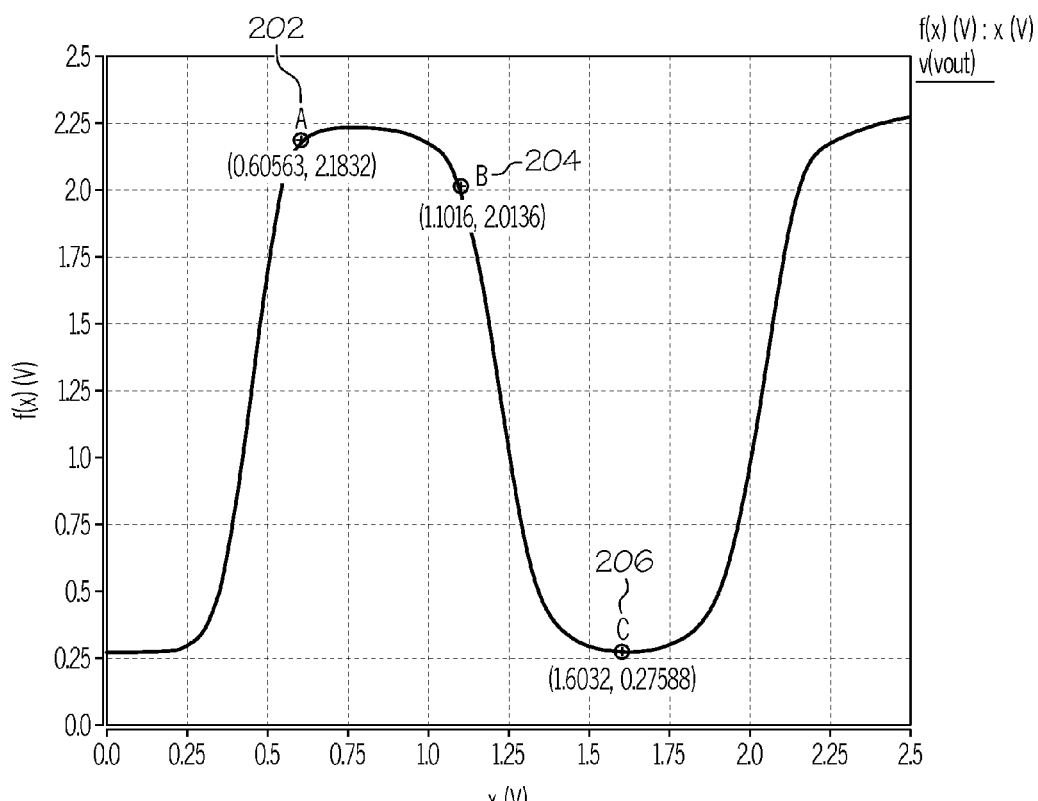
FIG. 2 is illustrating an implementation of a NAND gate using the circuit of FIG. 1, according to the present invention.

One example of a NAND logic gate implemented by this architecture 100 is shown in FIG. 2. The overall shape of curve 200 in FIG. 2 is substantially cubic-like. Point 202 on FIG. 2 is where both inputs 120 and 122 are Zero ("0") and point 202 is above the second threshold 160 producing a digital One ("1"). Point 204 on FIG. 2 is where one of the inputs 120 and 122 are digital One ("1"). As seen, this point is also above 1.2 volts on the Y-axis and is also interpreted as a digital One ("1"). For this example, $x^*$, the second threshold 160 is chosen as 1.2 volts on the Y-axis. Changes to the first threshold 130 and the second threshold 160 change the output logic. Point 206 shows the location on the curve where both inputs are a digital One ("1"). This value is well below $x^*$ on the Y-axis and is interpreted as a digital zero. Different values of $x_0$ and $x^*$ can produce the other types of gates.

Table 4 is a truth table for this implementation.

TABLE 4

| In0 | In1 | x | f(x) | Output |
|---|---|---|---|---|
| 0 | 0 | 0.60 | 2.18 | 1 |
| 0 | 1 | 1.10 | 2.01 | 1 |
| 1 | 0 | 1.10 | 2.01 | 1 |
| 1 | 1 | 1.60 | 0.28 | 0 |

In Table 4 the first threshold or reference signal 130 is denoted $x_0$ and the second threshold or reference signal 160 is denoted $x^*$. In this example $x_0 = 0.6V$ $x^* = 1.2V$ and changes to either $x_0$ and/or $x^*$ changes the output.

Second Embodiment of Dynamically Configurable Logic Gate

Figure 3:
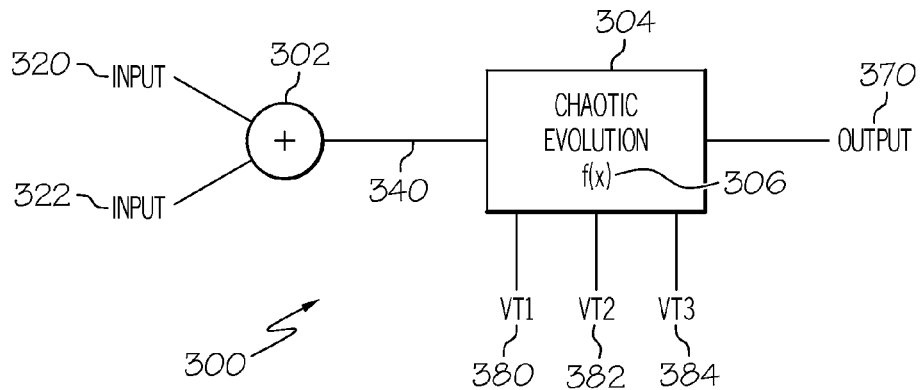
FIG. 3 is a schematic diagram illustrating another embodiment of a high level circuit architecture for a dynamically configurable logic gate, according to the present invention.

FIG. 3 is a schematic diagram illustrating another embodiment of a high level circuit architecture 300 for a dynamically configurable logic gate, according to the present invention.

An input summer or input adder 302 accepts two input signals 320 and 322 to form a summed signal 340. The summed signal is the input to the nonlinear or chaotic element 304 with nonlinear function 306 which is configured to apply the nonlinear function 306 to the summed signal 340 to produce a nonlinear output signal 370. The nonlinear function is 306 and/or the dynamic regions upon which the summed signal 340 is mapped is changed in response to change of at least one of the reference signals 380, 382, and 384. The nonlinear output signal 370 corresponds to a plurality of different logic gates responsive to adjusting one or more of the reference signals 380, 382, and 384 and/or the nonlinear function 306.

In this circuit architecture 300 the reference signals 380, 382, and 384 into the chaotic function are discrete. The output stage is also changed so that the comparator is removed and a digital value is generated from the nonlinear function 304. With these changes, the nonlinear function 306 is changed. Previously, the threshold voltage, $X_0$, used to select the starting point of the analog voltage into the f(x) of the chaotic function, and the other threshold voltage, x*, was an analog compare point. In this implementation there are three voltages that change the function of the f(x) 306 itself.

Figure 4:
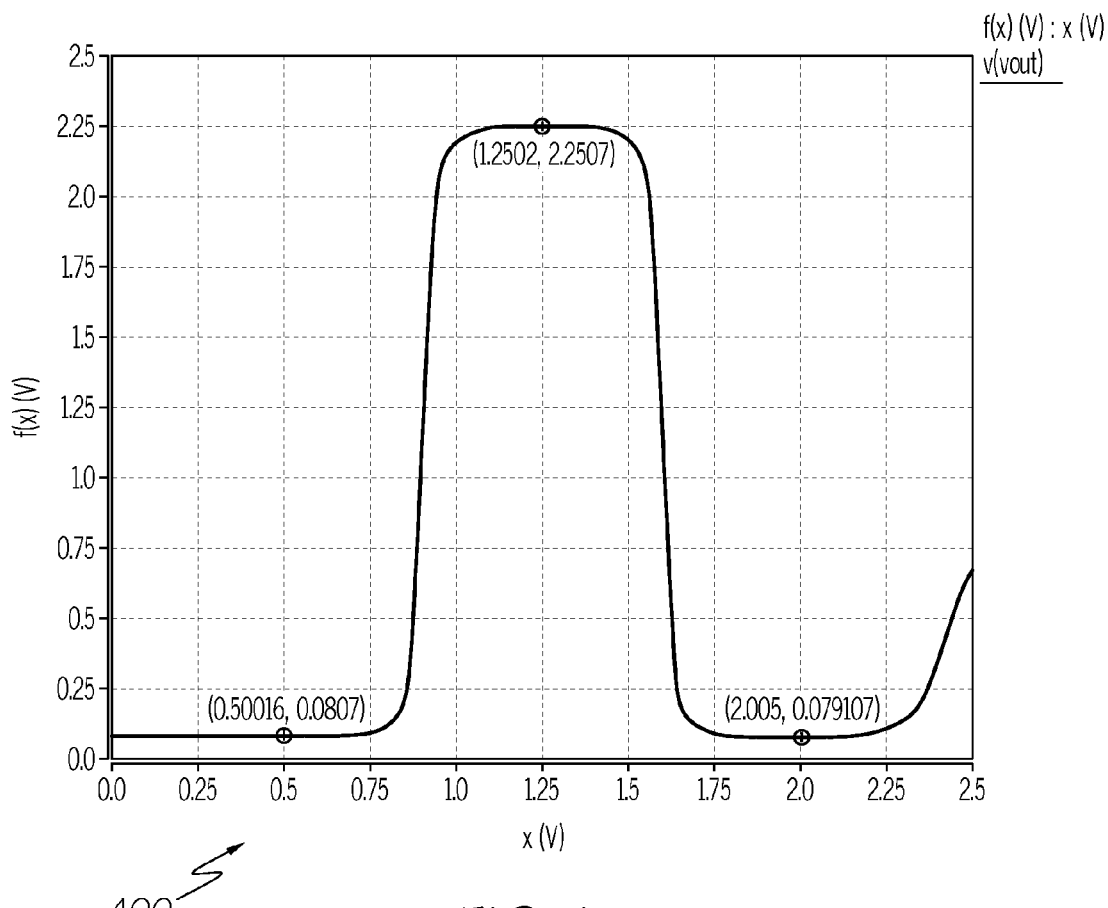
FIG. 4 is illustrating an implementation of a XOR gate using the circuit of FIG. 3, according to the present invention.

FIG. 4 is illustrating an implementation of a XOR gate using the circuit of FIG. 3, according to the present invention. As previously mentioned, the reference signals 380, 382, and 384 control the low-to-high and high-to-low transitions of the function f(x) 306 itself. The shape of the curve still looks cubic-like, however, the top and bottom of the curve are flattened. The threshold voltages are then used to move the rising and falling edges of the function 306. Instead of moving the input voltages 320 and 322 with respect to the attractors of the chaotic function 306, in this embodiment the attractors of the chaotic function 306 are moved to match the inputs 320 and 322. These changes bring about a reduction in power and a significant reduction in the physical area of the dynamically configurable device.

Figure 5:
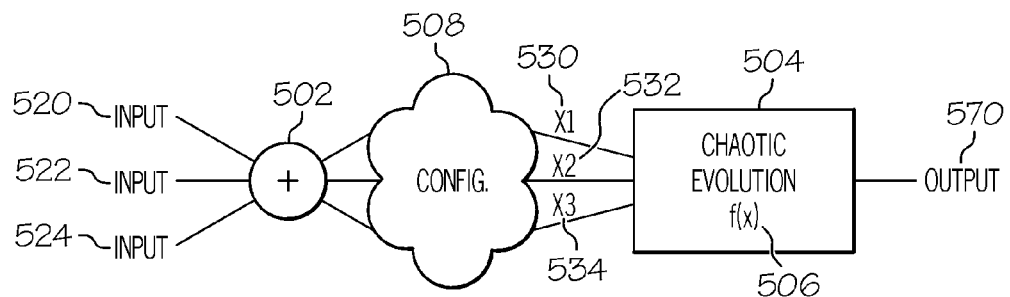
FIG. 5 is a schematic diagram illustrating another embodiment of a high level circuit architecture for a dynamically configurable logic gate, according to the present invention.

Table 5 is a truth table of the XOR example gate implementation as shown in FIG. 5.

TABLE 5

| In0 | In1 | x | f(x) | Out |
|---|---|---|---|---|
| 0 | 0 | 0.50 | 0.08 | 0 |
| 0 | 1 | 1.25 | 2.25 | 1 |
| 1 | 0 | 1.25 | 2.25 | 1 |
| 1 | 1 | 2.00 | 0.08 | 0 |

In this XOR gate example, for all gate types, the input voltages shown by the X-axis are approximately 0.5 V for both inputs at zero, 1.25 V for one input at zero and one input at one, and 2.0 V for both inputs at one. The threshold voltages are selected for transitions that occur at the median point between the input voltages. For the XOR example, the first transition from 0 to 1 is at approximately 0.88 V. The second transition from 1 to 0 is at approximately 1.63 V. Therefore, as can be seen in the diagram, the three points shown on the curve produce the truth table for the XOR gate.

Third Embodiment of Dynamically Configurable Logic Gate

In this embodiment, the power is further reduced using an all digital CMOS implementation for the dynamically configurable logic gate. The major elements with the other embodiments of the dynamically configurable logic gate are present in this embodiment. The input summer provides the count of the inputs represented as a state space. The configuration operates as the threshold mechanism to change the mapping of the input state space to the chaotic evolution. The nonlinear or chaotic evolution provides the non-linear function to convert to the output. Because of the full digital nature, the static power is reduced to substantially zero.

FIG. 5 is a schematic diagram illustrating another embodiment of a high level circuit architecture 500 for a dynamically configurable logic gate, according to the present invention. An input summer or input adder 502 accepts three input signals 520, 522 and 524 to form a digital state output signals 530, 532, and 534. Stated differently the digital state output signals 530, 532, and 534 represent the number of "1"s present on the input of the nonlinear or chaotic element 504 that implements nonlinear function f(x) 504. The configuration block 508 arranges f(x) inputs, thus shaping the function f(x). In this embodiment the static is reduced to substantially zero.

Figure 6:
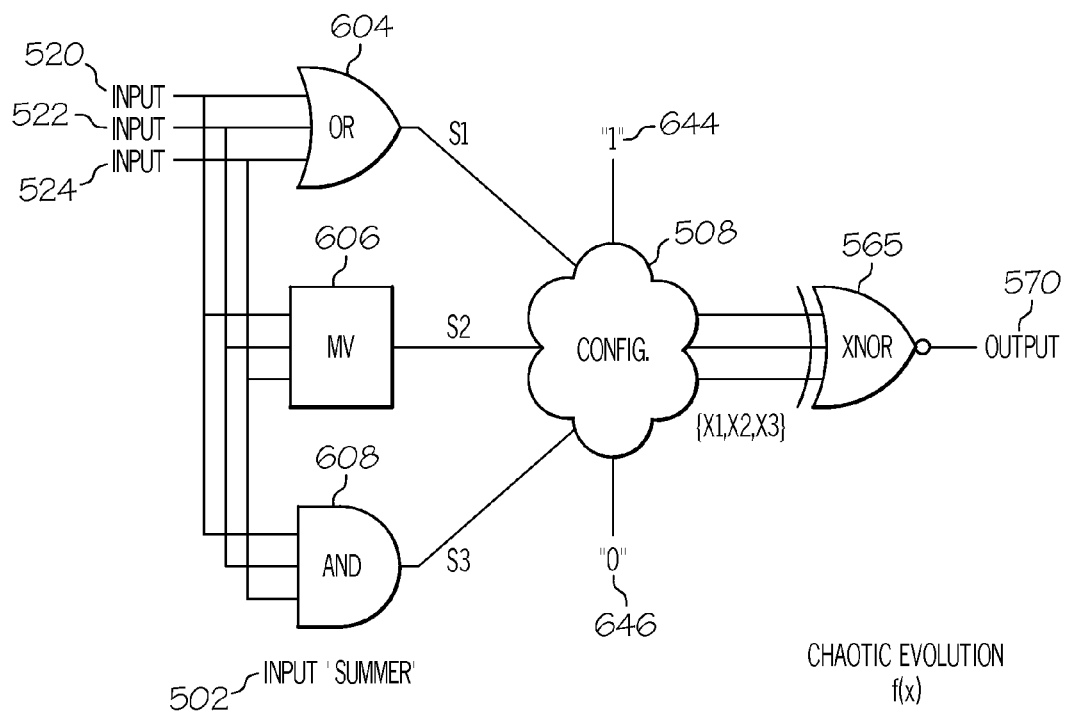
FIG. 6 is a schematic view of the input summer of FIG. 5, according to the present invention.

FIG. 6 is a schematic view 600 of the input summer 502 of FIG. 5, according to the present invention. The inputs 520, 522, 524 as shown are feed in parallel to an OR gate 604, a majority vote 606, and AND gate 608. The three signals S1, S2, and S3 represent the state of the input. For example, S1 is a '1' if at least one of the three inputs 520, 522, and 524 is set to '1'. S2 is a '1' if at least two of the three inputs, 520, 522, and 524 is set to '1'. And S3 is a '1' if all 3 inputs, 520, 522, and 524 set to a '1'.

Figure 7:
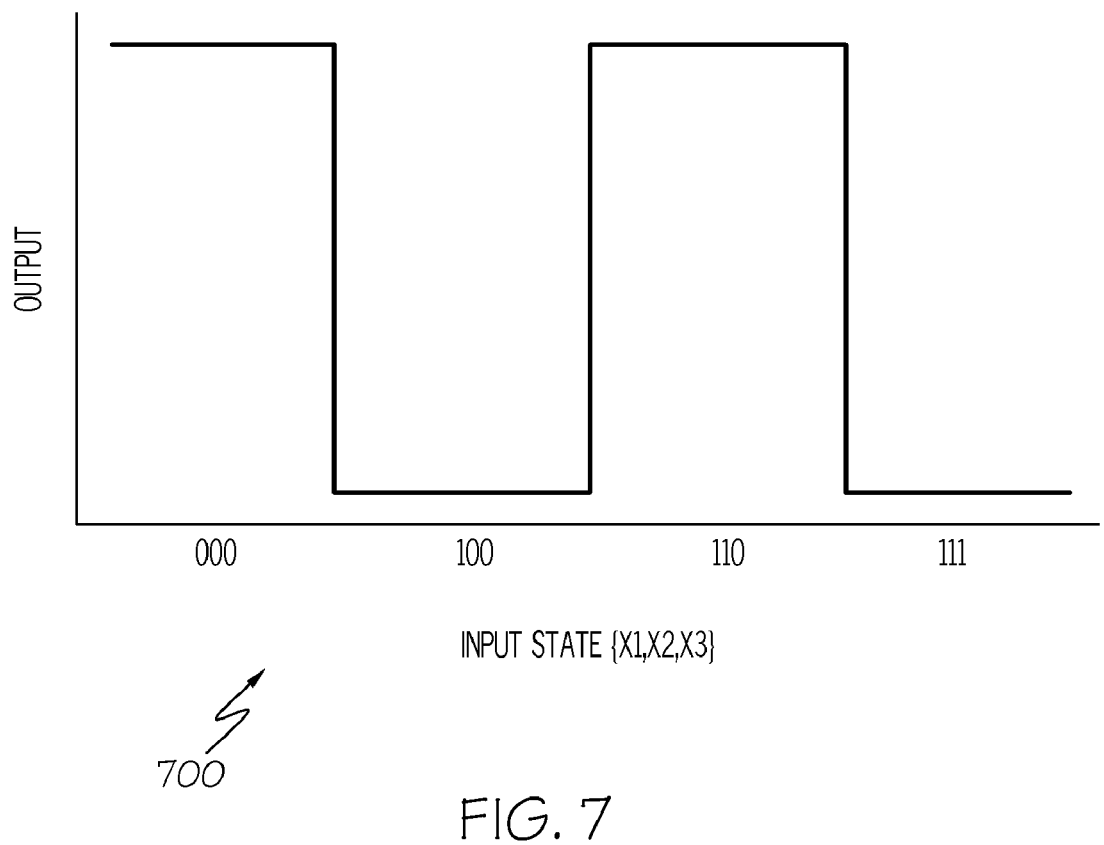
FIG. 7 is an output waveform of the logic implemented by the dynamically configurable logic gate of FIG. 5, according to the present invention.

In FIG. 6, the '1' denoted 644 and the '0' denoted 646 feed into the configuration block 508 to map the input sum state S1, S2, S3 onto a restricted range of the nonlinear function f(x) 506. Referring to FIG. 7, the input sum state S1, S2, S3 range is shown on the x-axis of the non-linear function f(x) 506 as the inputs 520, 522, and 524 vary. For example to operate as an inverting gate (NAND, NOR, or inverting majority vote) the input state X1, X2, X3 is restricted to operate on the first half of the x-axis {0,0,0} and {1,0,0}. In order to accomplish this, both X2 and X3 are tied to the '0' input to the configuration block 508, and X1 is tied to the appropriate sum state input S1, S2, or S3 to produce the correct inverting logic gate function. In another example, to produce a non-inverting gates (AND, OR, and majority vote) the range of the input state is restricted to the middle two of the four states in FIG. 7 i.e. {1,0,0} and {1,1,0}. In this non-inverting example, X1 is tied to a '1' and X3 tied to a '0'. Then by applying either S1, S2, or S3 to X2 the appropriate logic functionality is produced.

In contrast both the XOR and XNOR functions do not require restricting the input state to a portion of nonlinear function f(x) 506. To produce an XNOR, the states S1, S2, S3 are directly mapped to X1, X2, X3. And to produce an XOR, the input states S1, S2, S3 are both inverted and reversed in order before mapping it onto X1, X2, X3. In both of the XOR and XNOR case, the '0' and '1' inputs to the configuration block 508. are unused.

An example implementation of the configuration block 508 is shown in the section below entitled "Morphing Multiplexer Embodiment for an Array." The output of the configuration block 508 is feed as inputs to XNOR 665 with output 570.

Table 7 is a truth table of the XNOR example gate implementation as shown in FIG. 5 and FIG. 6.

TABLE 7

| In0 | In1 | In2 | Out |
|---|---|---|---|
| 0 | 0 | 0 | 1 |
| 1 | 0 | 0 | 0 |

TABLE 7-continued

| In0 | In1 | In2 | Out |
|-----|-----|-----|-----|
| 1 | 1 | 0 | 1 |
| 1 | 1 | 1 | 0 |

With reference to Table 7 and FIGS. 5 and 6, in this embodiment the input summer 604, 606, 608 with states S1, S2, S3 pass directly through to the nonlinear function f(x) 665 inputs X1, X2, X3. As can be seen in the table below, with all inputs at zero, the input state is at 000 producing a one output. Continuing through the rest of the states, 100 produces a zero, 110 produces a one, and 111 produces a zero.

In this embodiment of the dynamically configurable logic gate a rich set of two and three input logic gates are shown in Table 8. The size, power, and configuration complexity is further reduced. The static power is eliminated.

TABLE 8

| | Function | | |
|---|---|---|---|
| | X1 | X2 | X3 |
| OR3 | 1 | S1 | 0 |
| Majority | 1 | S2 | 0 |
| AND3 | 1 | S3 | 0 |
| NOR3 | S1 | 0 | 0 |
| NAND3 | S3 | 0 | 0 |
| XNOR3 | S1 | S2 | S3 |
| Zero | 1 | 0 | 0 |

FIG. 7 is an output waveform 700 of the logic implemented by the dynamically configurable logic gate of FIG. 5, according to the present invention.

Circuit Implementation of the Nonlinear or Chaotic Element

Figure 8:
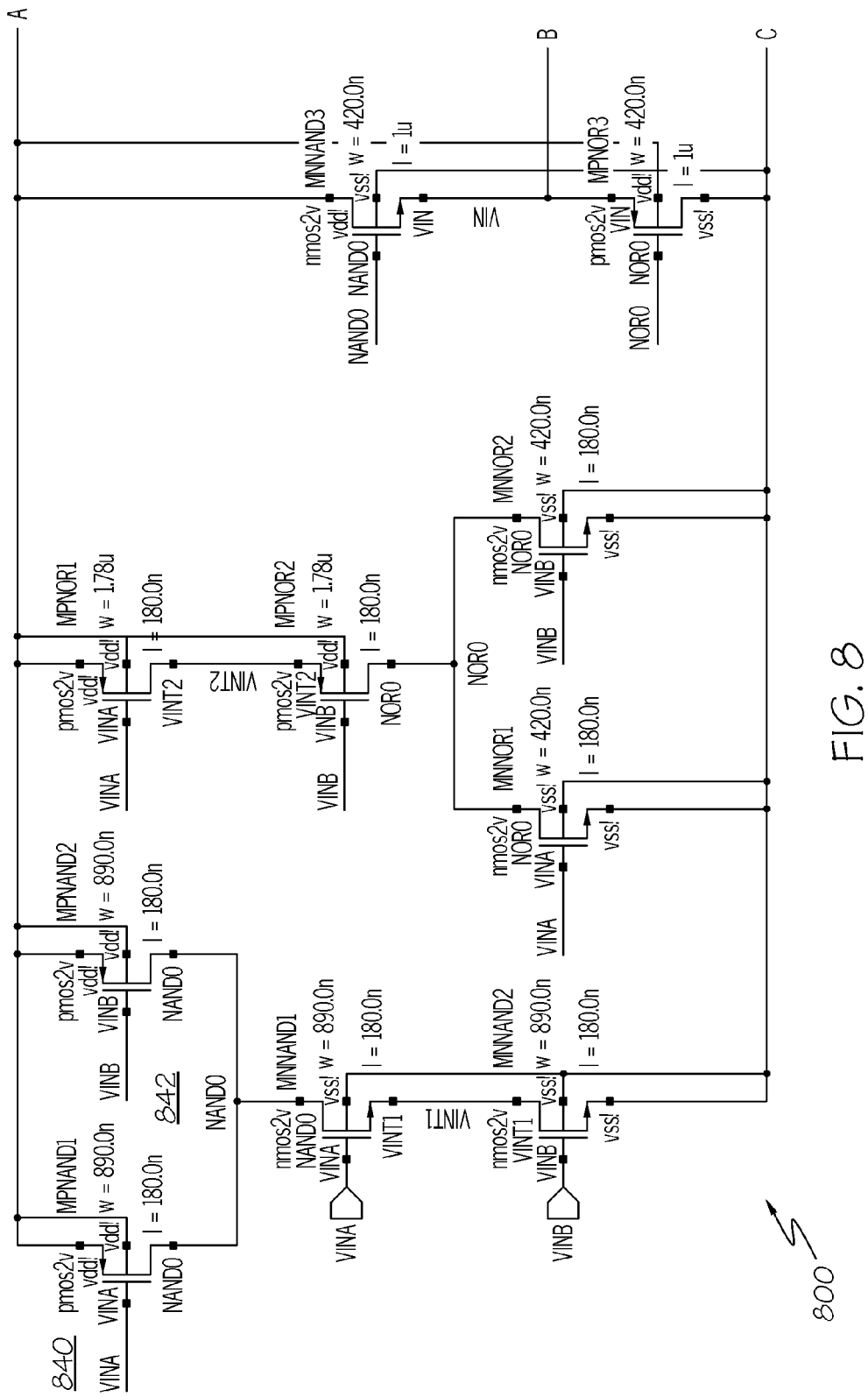
FIG. 8 is an embodiment shown in FIG. 3, where the input section does not incorporate a reference voltage.
Figure 9:
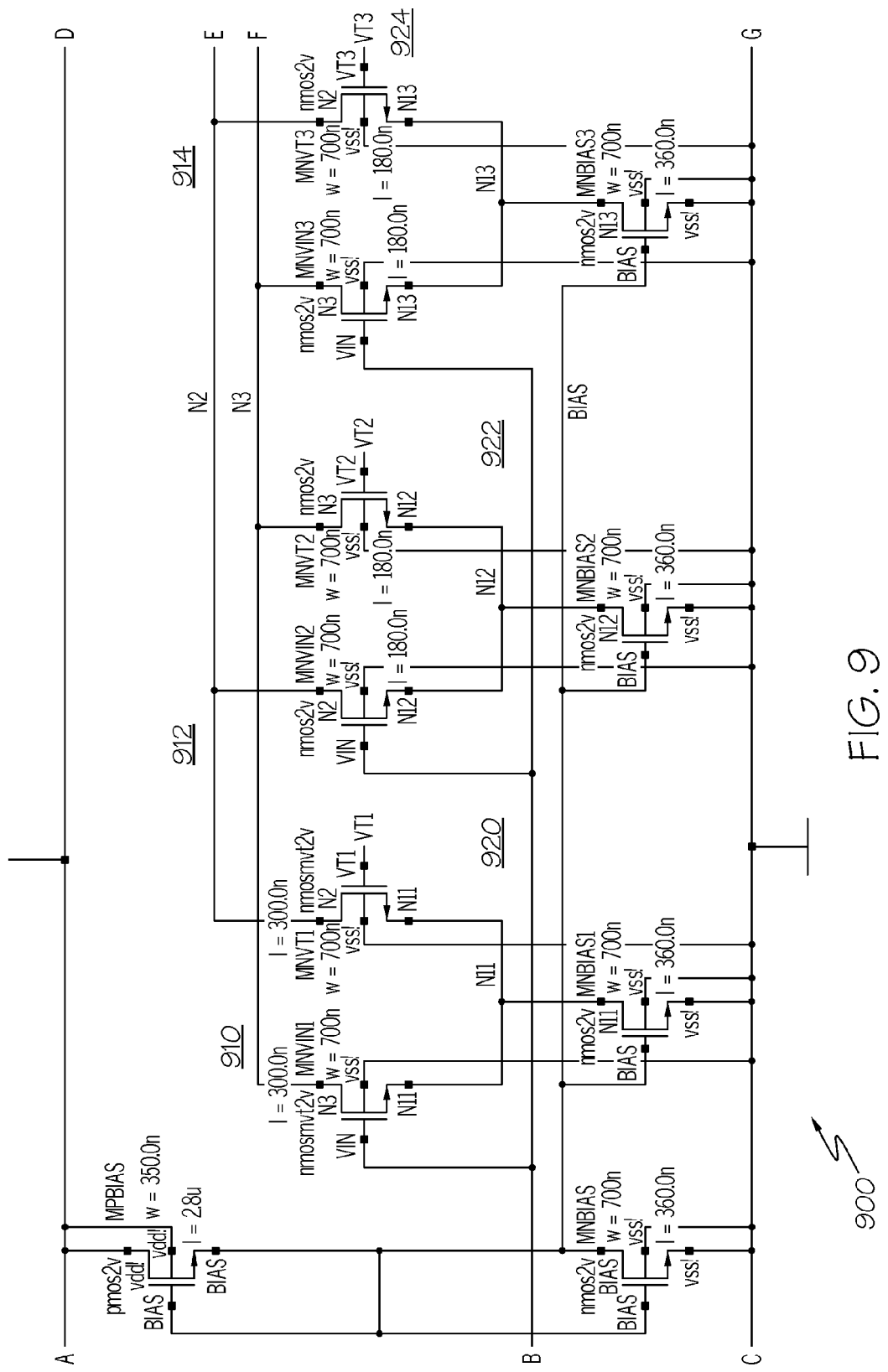
FIG. 9 and FIG. 10 are schematic diagram illustrated in sections, an example circuit implementation of the nonlinear element for producing a nonlinear function of FIG. 1 and FIG. 3, according to the present invention.
Figure 10:
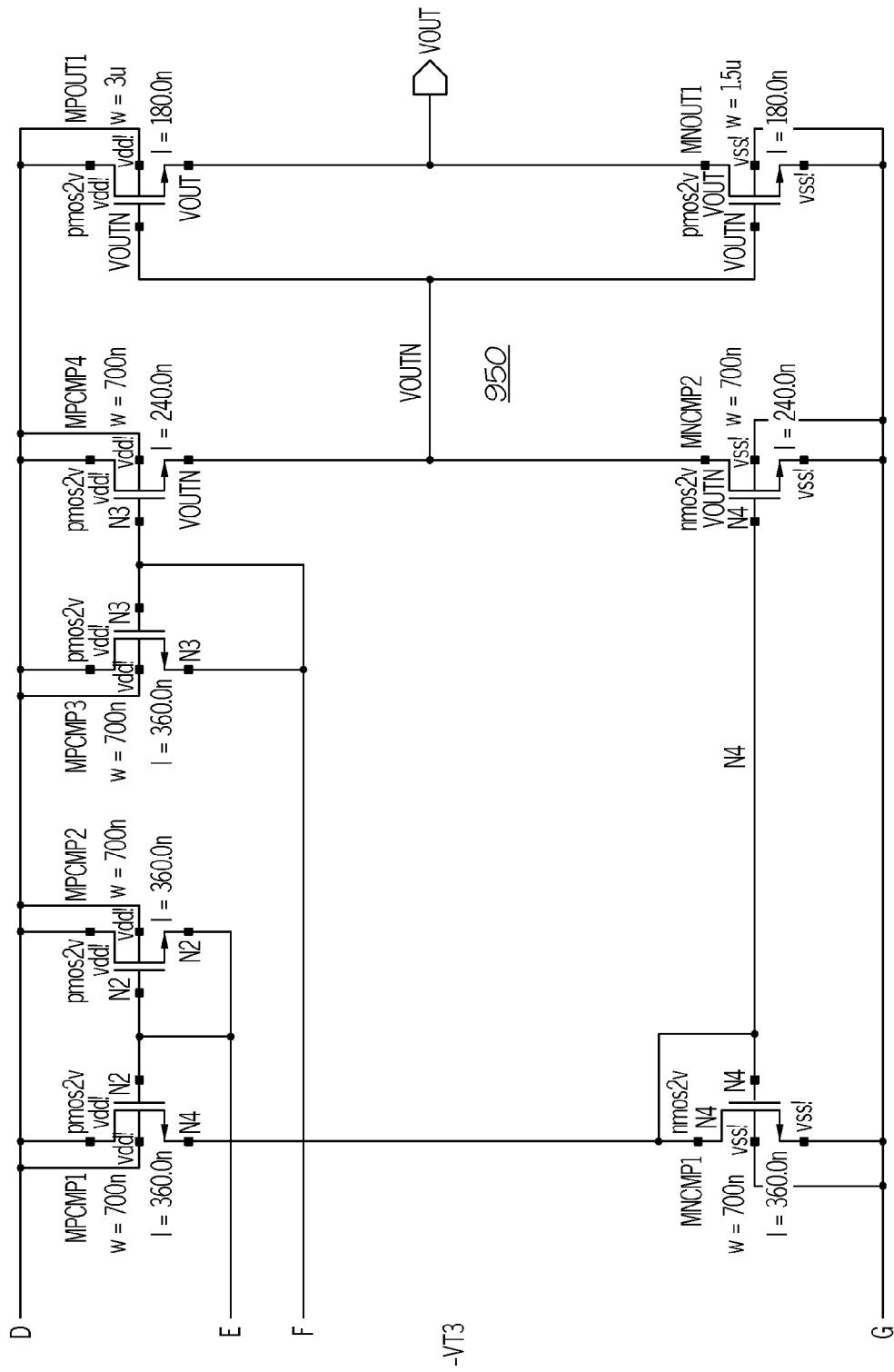

FIG. 8 is an embodiment shown in FIG. 3, where the input section does not incorporate a reference voltage. More specifically FIG. 8 an input circuit 800 receives two inputs VINA 840 and VINB 842. To be complete, in order to illustrate the entire circuit across the three FIGS. 8, 9, and 10, FIG. 8 is electrically coupled to FIG. 9 by nodes A, B, and C. In turn FIG. 9 is electrically coupled to FIG. 10 by nodes D, E, F, and G.

FIG. 9, and FIG. 10 is a schematic diagram illustrated in sections of an example circuit implementation of the nonlinear element for producing a nonlinear function to either of the circuits of FIG. 1 and FIG. 3, according to the present invention. The two inputs are translated to a combination of the three voltage levels based on the number of ones at the inputs. FIG. 9 is the nonlinear circuit 900 that implements the nonlinear or chaotic function f(x). The nonlinear function in this example is based on three current mirrors 910, 912, and 914 the output of which control the transition points of the nonlinear equation f(x). These three current mirrors 910, 912, and 914 are controlled by the threshold voltages VT1 920, VT2 922, and VT3 924. Node B, more specifically the three current mirrors 910, 912, and 914 include three differential amplifiers which combine to form the two currents N2 and N3. Whenever the input voltage V1 crosses a threshold reference (VT1, VT2, VT3), one of the differential amplifiers flips which causes the current difference between N2 and N3 to flip and thus the output voltage VOut 950 changes state.

Embodiments of a Memory Latch Logic Gates

Figure 11:
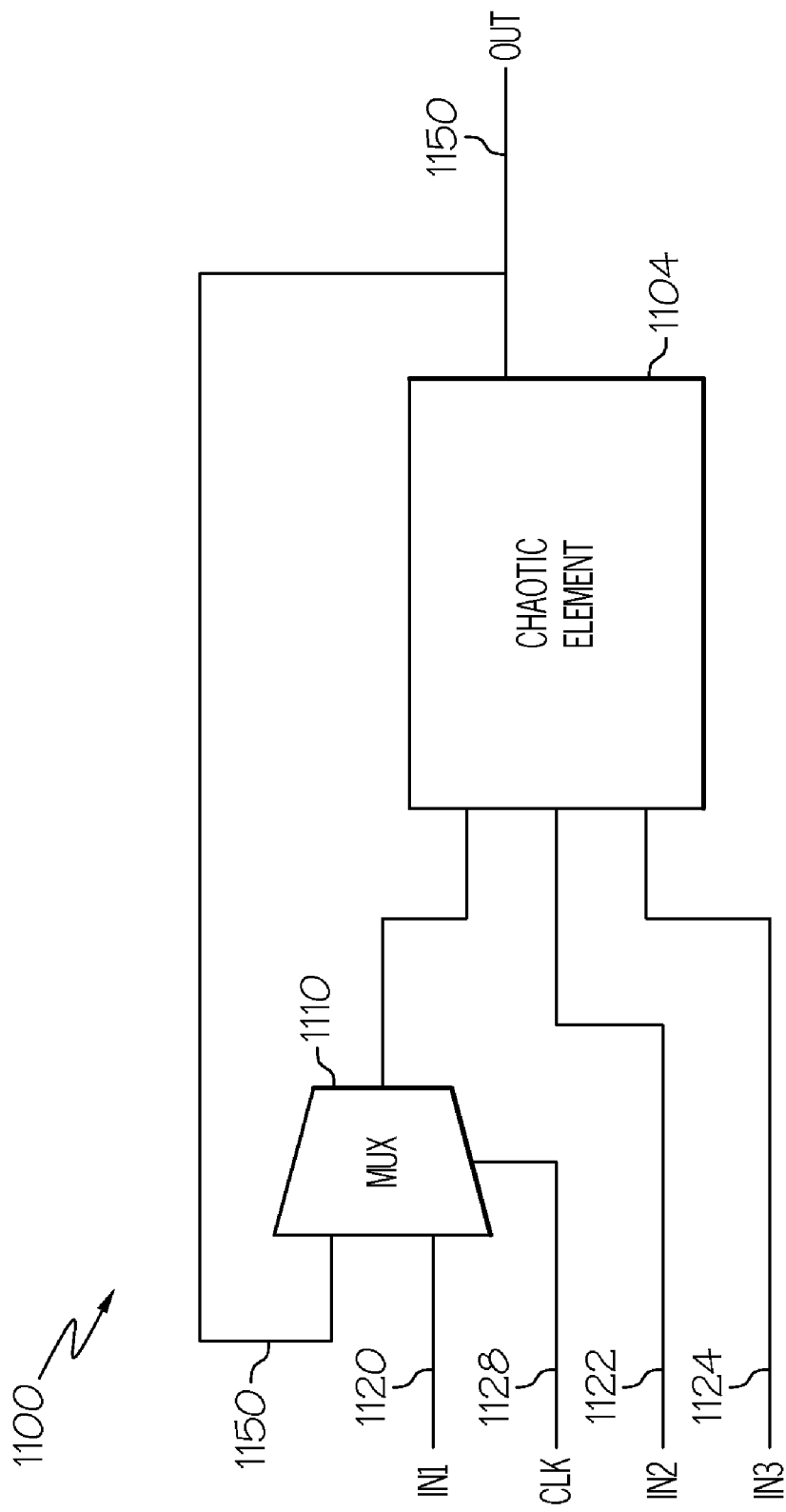
FIG. 11 is a schematic diagram of a circuit illustrating one embodiment of a memory element implemented a D-Latch for a dynamically configurable logic gate 1102, according to the present invention.

FIG. 11 is a schematic diagram of circuit 1100 illustrating one embodiment of a memory element implemented a three-input D-Latch for a dynamically configurable logic gate 1104, according to the present invention. The dynamically configurable logic gate 1104 receives an inputs 1122 and 1124 to produce an output 1150. To form a memory latch a multiplexer 1110 is included in the circuit 1100. The multiplexer 1110 receives an input 1120 and the output 1150 of the dynamically configurable logic gate 1102 is selectively multiplexed by the clock input 1128. Stated differently, the clocked input 1128 is used to switch between input 1120 and feedback 1150. Further this feedback reinforces the input value in clock latch phase. When the clock is in the transparent phase, the external input controls the gate making it completely combinatorial. When the clock is switched to the clock latch phase, the gate output is switched to the input, which reinforces and holds the value of the external input. At this point, the external input can change and not affect the output of the gate. The other input(s) can be used for asynchronous set or reset signals.

Table 9 illustrates different D-Latch of FIG. 11.

TABLE 9

| Latch Type | IN1 | IN2 | In3 | Out | Element Gate |
|---|---|---|---|---|---|
| D | D | 0 | 0 | Q | OR |
| D | D | 0 | 1 | Q | Majority Vote |
| D | D | 1 | 0 | Q | Majority Vote |
| D | D | 1 | 1 | Q | AND |
| D with async Set | D | Set | 0 | Q | OR |
| D with async Set | D | 0 | Set | Q | OR |
| D with async Set | D | Set | 1 | Q | Majority Vote |
| D with async Set | D | 1 | Set | Q | Majority Vote |
| D with async Reset | D | !Reset | 0 | Q | Majority Vote |
| D with async Reset | D | 0 | !Reset | Q | Majority Vote |
| D with async Reset | D | !Reset | 1 | Q | AND |
| D with async Reset | D | 1 | !Reset | Q | AND |
| D with async Set/Reset | D | Set | !Reset | Q | Majority Vote |
| D with async Set/Reset | D | !Reset | Set | Q | Majority Vote |

In this embodiment, different D-Latch configurations as indicated in column labeled "latch type" for a three input dynamic nonlinear element is shown. The "IN1" input is always the "D" input for the latch. The other two inputs can either be hardwired or used for "Set", "Reset", or both. The Out column is the output of the dynamic nonlinear element. Depending on the configuration of the other inputs, the dynamic nonlinear element is programmed to the correct gate type to produce the D-Latch as described in Element Type. As an example, for a D-Latch with an asynchronous Reset, if the second input is held to a zero, the chaotic gate would be set to a "Majority Vote" gate. If the second input is held to a one, the chaotic gate would be set to an "AND" gate. This allows flexibility in the programming of the cell to provide optimization for the packing algorithms.

Table 10 illustrates different D-Latch of FIG. 11 with asynchronous reset.

TABLE 10

| Clk | D | NReset | Q | Formula |
|---|---|---|---|---|
| 0 | 0 | 0 | 0 | D & NReset |
| 0 | 0 | 1 | 0 | D & NReset |
| 0 | 1 | 0 | 0 | D & NReset |
| 0 | 1 | 1 | 1 | D & NReset |
| 1 | X | 0 | 0 | Q & NReset |
| _/ | X | 1 | Q | Q & NReset |

Table 10 shows the truth table for a D-Latch with asynchronous reset. When the clock is zero, the latch is in the transparent phase. In this phase it looks like a normal combinatorial gate. In this case ignoring the third input, the gate is programmed as an "AND" gate. When the clock is high, the reset is the only input that can affect the output. If the reset is taken low asynchronously, the output is reset to a zero. When the clock makes the transition from low to high with the reset held high, the value at the output, which matches the value on the input (with proper setup and hold), is latched and held through the clock high cycle. The clock values during the transparent phase and latch phase can be switched by inverting the clock. This allows the latch to capture data on the falling edge. A D Flip-flop can thus be created by placing two D-Latches back to back with inverted clock phases.

Overview of an Array of Dynamically Configurable Logic Gates

In order to provide more complex logic, the dynamically configurable logic gates are connected together to form larger digital functions. The first step is to form a combinatorial logic element (CLE) similar to what is available in FPGAs. The CLE is used to denote a high-level reference to each dynamically configurable logic gate. This CLE differs from those in the FPGA architectures because this design does not have a dedicated flip-flop. Instead, in this embodiment four dynamically configurable logic gates are combined in a single CLE that allows a great deal of flexibility to configure between logic and flip-flops or latches. For instance, these same gates could be capable of configuration as two flip-flops, one flip-flop and two 3-input gates, or four 3-input gates. Other possibilities include different combinations of logic gates and D-latches. This allows for better flexibility than FPGAs that may have more unused logic if the design is heavily combinatorial or has a greater proportion of flip-flops.

One design in this embodiments uses a functional design for micro-processors or micro-controllers. No matter the product, the architecture of the underlying chip advantageously utilizes the dynamically configurable logic gates to construct reconfigurable products.

Embodiment of an Single Selectable ChaoGate for an Array

Figure 12:
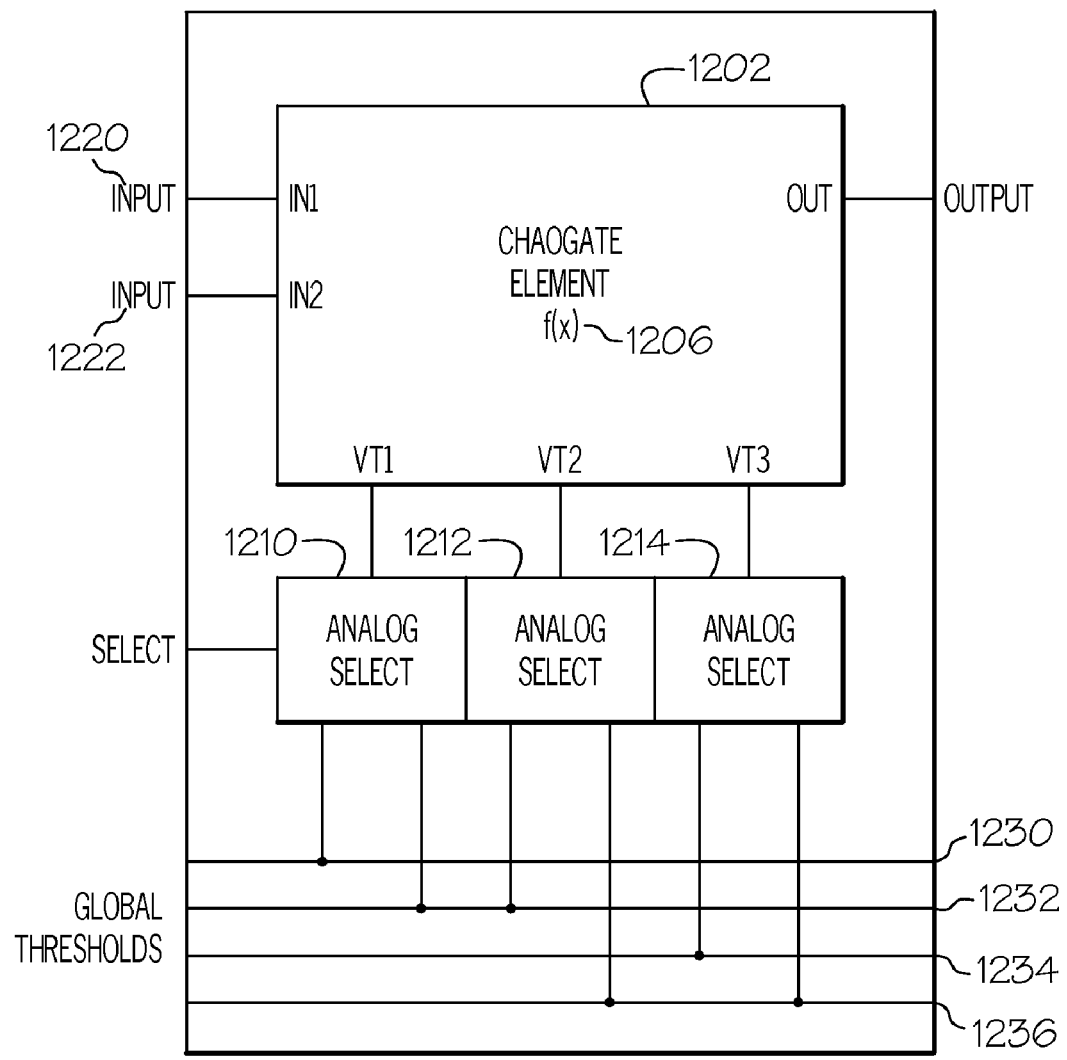
FIG. 12 is a schematic diagram illustrating one embodiment of a high-level circuit architecture for a dynamically configurable logic gate used in larger arrays, according to the present invention.

FIG. 12 is a schematic diagram illustrating one embodiment of a high-level circuit architecture for a dynamically configurable logic gate used in larger arrays, according to the present invention. In this embodiment, the dynamically configurable logic gate 1202 with two inputs 1220 and 1222 is part of an array of dynamically configurable logic gates. In this example, four global thresholds 1230, 1232, 1234, and 1236 are used to switch the nonlinear function 1206 through multiplexers 1210, 1212, and 1214 to switch between two possible voltages for each of the threshold voltage. The selections of the threshold voltages are personalized by connecting each input to one of four global thresholds 1230, 1232, 1234, 1236. This permits the creation of personalized gates for each possible combination of functions. The gates were created based on the function when the select bit was zero, f(0) 1206, and when the select bit was one, f(1). For instance, one type of gate would have an f(0) of "AND" and an f(1) of "XOR". Other gates were created as necessary. Examples of these include: f(0)="NAND", f(1)="NOR"; f(0)="NOR", f(1)="NAND", f(0)="OR", f(1)="OR" and more. Creating these gates allows the use of known place and route techniques for ASIC designs. In this example, even though a standard ASIC place and route techniques are used, the results are similar to using a homogenous array and programming the array through a single via mask to connect each of the analog multiplexer inputs into the dynamically configurable logic gate 1202 with the correct global threshold voltage. Using this architecture the dynamically configurable logic gate 1202 becomes building block for larger functional array. Also using this architecture the array can transform or "morph" between two functions by changing a single bit to change the underlying logic implemented by each dynamically configurable logic gate 1202. Example of the two functions is discussed further below in the section entitled "Examples Switching Between Multiple Functions."

Embodiment of an Array of Using Via Programmable Architecture

Figure 13:
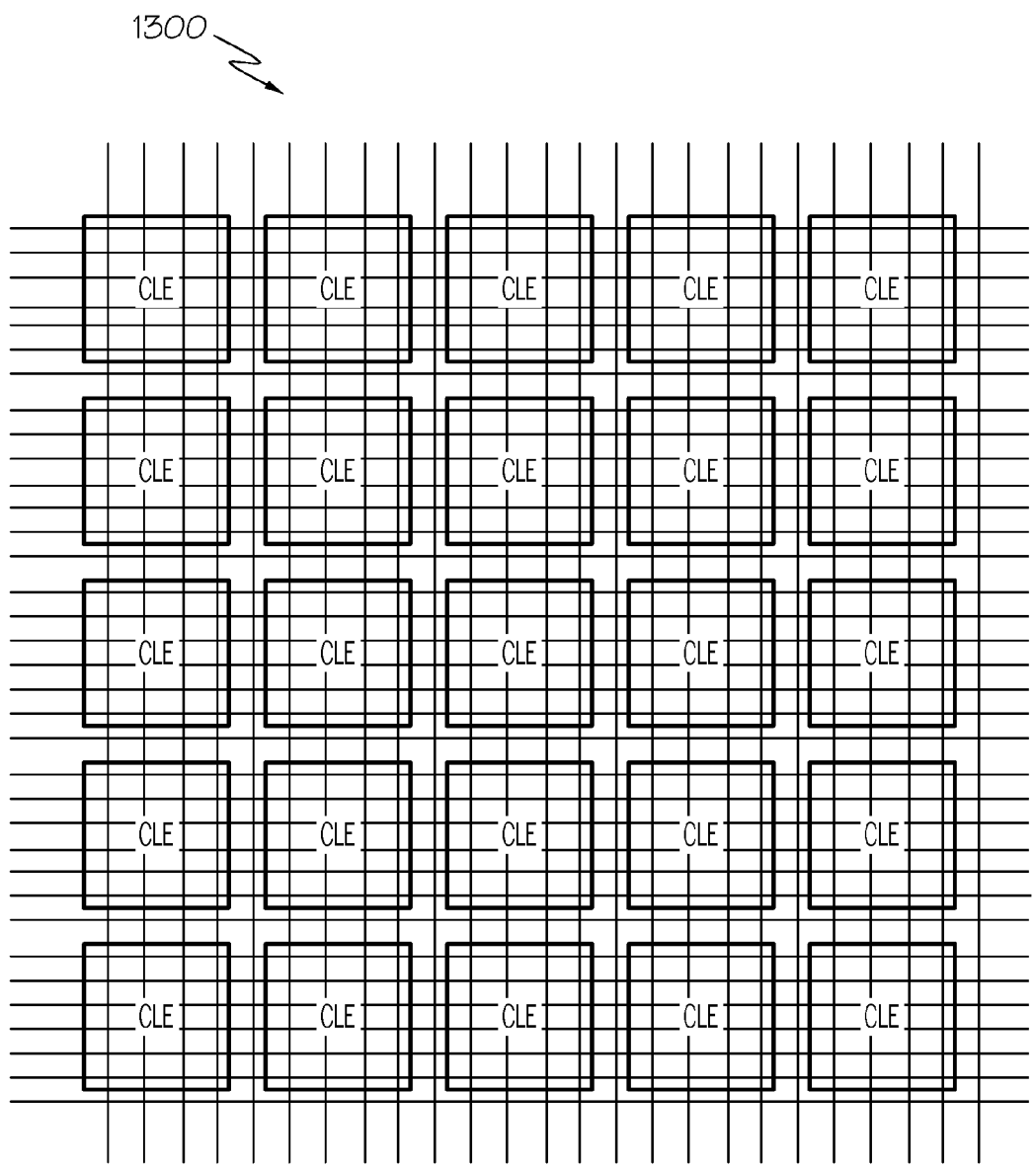
FIG. 13 illustrates a cross-section of a generic array, according to the present invention.

VPGA (via programmable gate array) is similar to an FPGA because of the regular programmable gate structure that makes up the logic array. However, since the routing is connected by vias instead of active gates, the logic blocks can be packed closer together. The FIG. 13, illustrates a cross-section of the generic array. 1300, according to the present invention. The horizontal and vertical routing above the cells are standard homogenous structure. Personalization is performed by adding vias on one or two layers to make connections.

Figure 14:
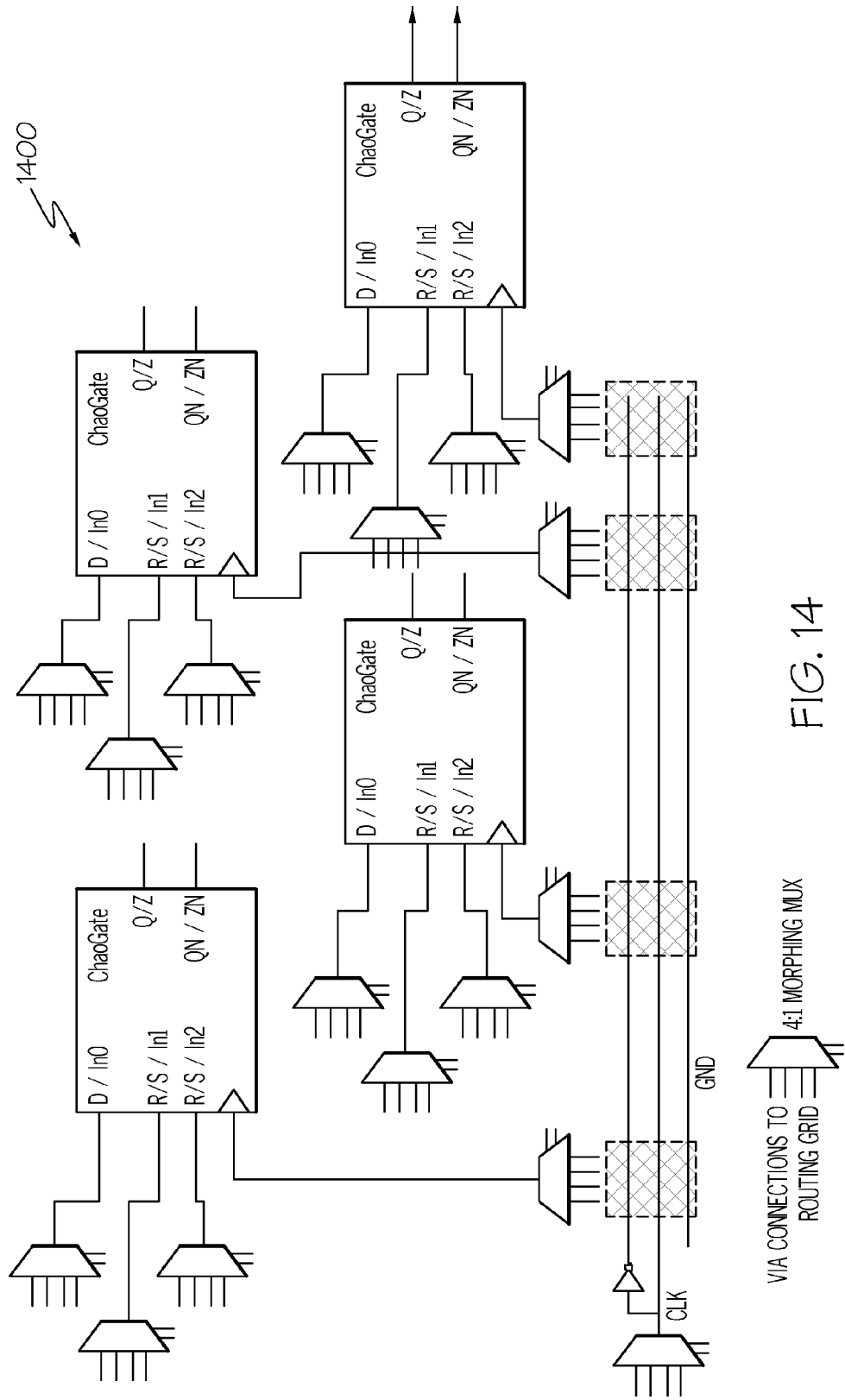
FIG. 14 illustrates an embodiment of an generic array element with select hits to morph the function for that array, according to the present invention.

Besides the known advantages with standard VPGA designs that map a single design onto the array, the present invention maps multiple designs onto the generic array. In one embodiment, the CLE is designed to be able to switch between two to four design implementations by using global select bits. FIG. 14 illustrates an embodiment of the CLE that would use the select bits to morph the function for that array, according to the present invention. This CLE has been altered from the previously shown reconfigurable CLE described previously. In this case, the multiplexers illustrated are not for configuration of the circuit. Instead, they are for selecting between four programmed circuits. These can be thought of as a nicknamed "Morphing Multiplexer" (MM). As shown in FIG. 14, Each MM has four inputs (in0, in1, in2, and in3) and two select bits. Therefore, given four designs, A, B, C, and D, when design A is implemented in the array, all of its routing will be connected to in0 of the MMs. Likewise, design B will be connected to in1 of the MMs, and designs C and D similarly are connected to in2 and in3 respectively. This way, when the two global select bits change, the whole function of the circuit changes.

The clock routing into each element is a special case in FIG. 14. Obviously, the overall clock scheme will be important to control the clock skew in the array. This will help ease setup and hold issues with the array timing. Within each CLE, each dynamically configurable logic gate is able to become a combinatorial element, a D-Latch, or half of a flip-flop depending on how the clock is connected. The "CLK" and "not CLK" signals can provide the two phases for the flip-flop or either phase of transparency for the D-Latch. By connecting to "Gnd", the ChaoGate is configured as combinatorial.

In this embodiment a configurable block with multiple chaotic gates is described. In one embodiment an array using ASIC technology switches between two functions. These are "hard-wired" or predetermined functions. Other embodiments create configurable blocks that provide a larger selection of functions. The larger selection of functions provide a dynamic and programmable alternative to current FPGA implementations. By grouping multiple elements into a single block, the problems of top level routing become more manageable. The targets for the design would allow multiple inputs and outputs, flexible functions, both combinatorial and Flip-Flops/Latches, and a minimization of the control structures to simplify reconfiguration. Aspects of this embodiment includes configurable routing, especially in top level routing, where different functions have different structures and data flow (i.e., adders versus multiplier). This provides a balance between ASICI and FPGA, and eliminates the inflexible nature of ASIC routing. The FPGA configurable routing has too many bits for quick configuration.

In the embodiment where the configurable block is switched between only two functions, the routing modifications are kept to a minimum. It is important to note however that two similar functions can have very different routing structures. For instance, the adder and multiplier are both elements of an ALU, but they are very different in how the data flows from the inputs to the outputs. When expanding the requirements to be able to configure an array for any function, the top level routing needs the flexibility in its configuration as well.

Morphing Multiplexer (MM) Embodiment for an Array

Figure 15:
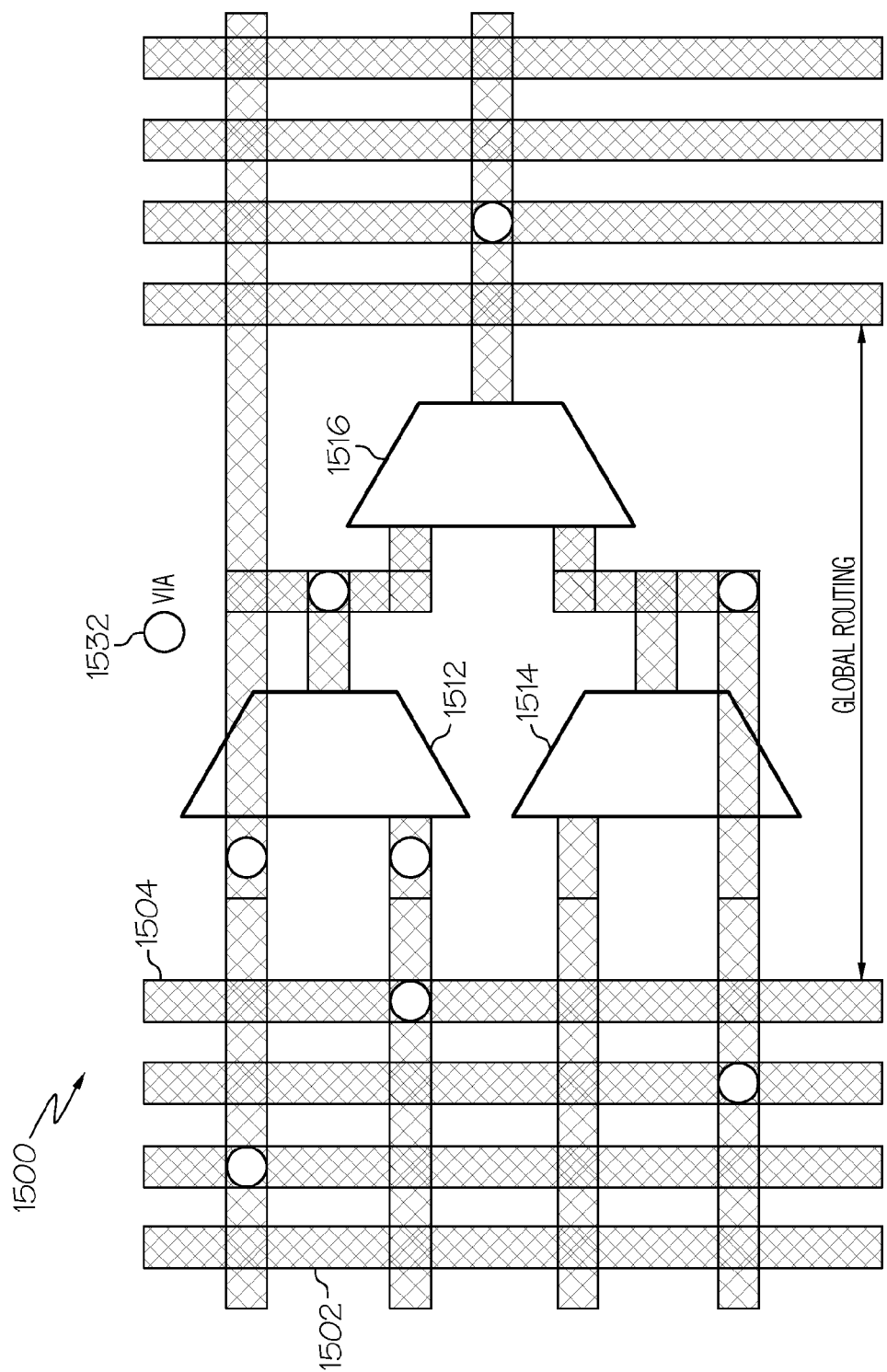
FIG. 15 illustrates a four-to-one multiplexer, according to the present invention.

FIG. 15 illustrates a design of a four-to-one multiplexer 1500, according to the present invention. The four-to-one multiplexer 1500 is constructed from three two-to-one multiplexers 1512, 1514, and 1516 as shown. Lines denoted by a first cross hatching pattern (red) 1502 and lines denoted by a second cross hatching pattern 1504 (green) are two metal layers that are standard masks for the array. The long vertical metal 1506 (green) represents global routing. The different tracks of this metal would have different outputs coming from other gates. The horizontal metal stripes 1508 (red) are connected to the global routing by placement of a via. As illustrated in FIG. 15 for the bottom multiplexer 1514, the metal 1508 (red) also bypasses the multiplexer and the via connects directly to the next multiplexer layer 1530. The top layer 1532 also allows for bypassing the entire multiplexer structure. When the inputs to the multiplexer structure are common, the bypass capability improves timing and power dissipation.

The MM is used within the dynamically configurable logic gate to select the gate type for each of the designs. The MMs will be within the "Config" cloud 638 in FIG. 5 and FIG. 6 for the third embodiment of the dynamically configurable logic gate describe previously. They will be programmed with vias as described previously. This allows the dynamically configurable logic gate to become four different gate types depending on the select bits.

Embodiment of Select Array Structure

Figure 16:
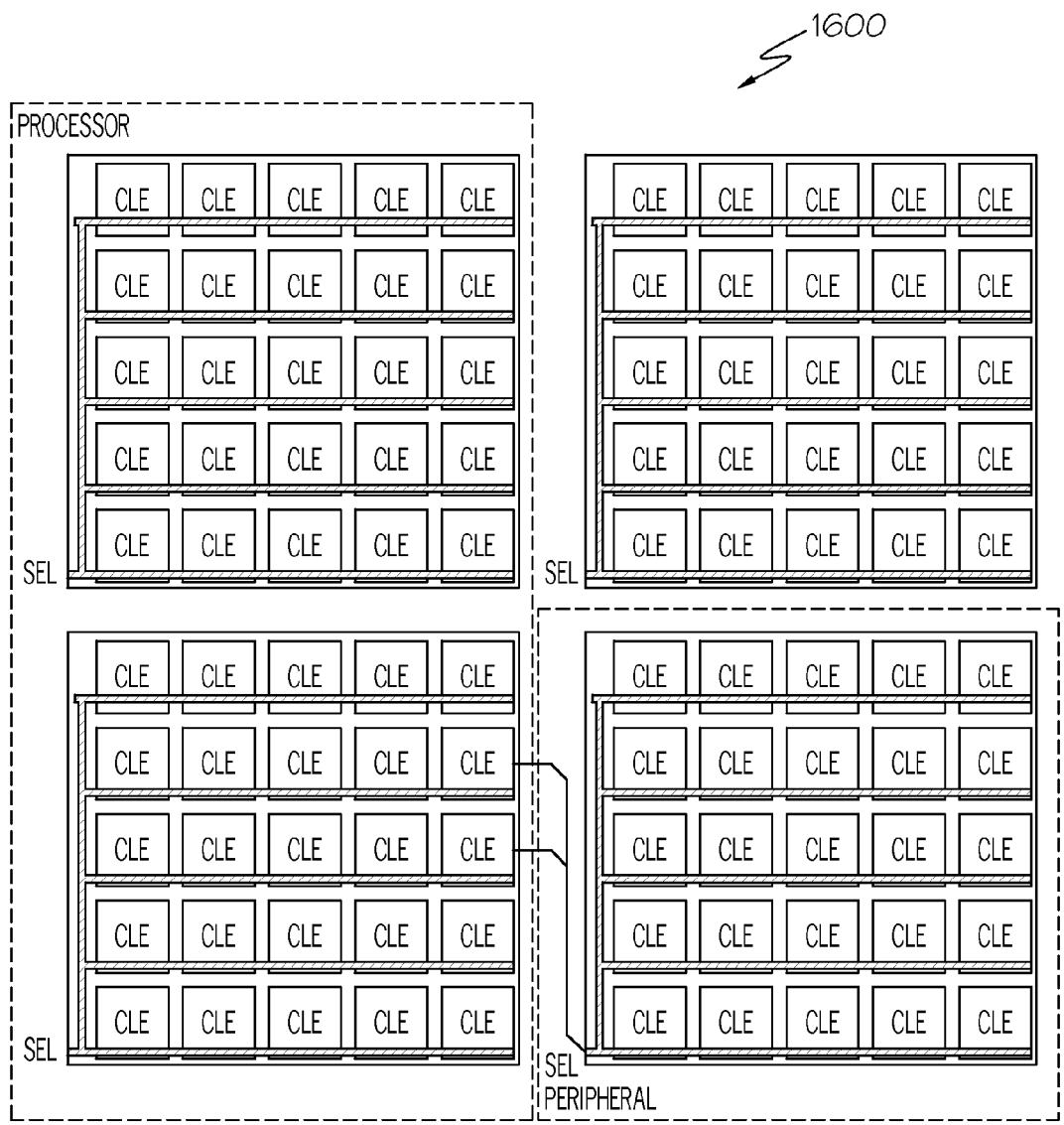
FIG. 16 is an array with the ability to individually control selections within section of the array, according to the present invention.

As shown in FIG. 16, an array 1600 with the ability to individually control selections within sections of the array is shown. The select bits are global within each array. However, the ASIC is made of multiple individual arrays that can be connected to different select bits. This allows greater flexibility for creating different architectures. For example, the processor type could be selected from either I/Os or a control interface, while under control of the processor, different peripherals could be selected in another section of the chip.

This selection scheme could also be used within the processor with the command decode being processor specific, but parts of the ALU being selected by the decode block (i.e. multiplier and divider instructions, etc.). This allows greater flexibility than one global select for the whole ASIC.

Examples Switching Between Multiple Functions

The following is a non exhaustive list of circuits that change to provide different functions using dynamical configurable logic gates.

Figure 17:
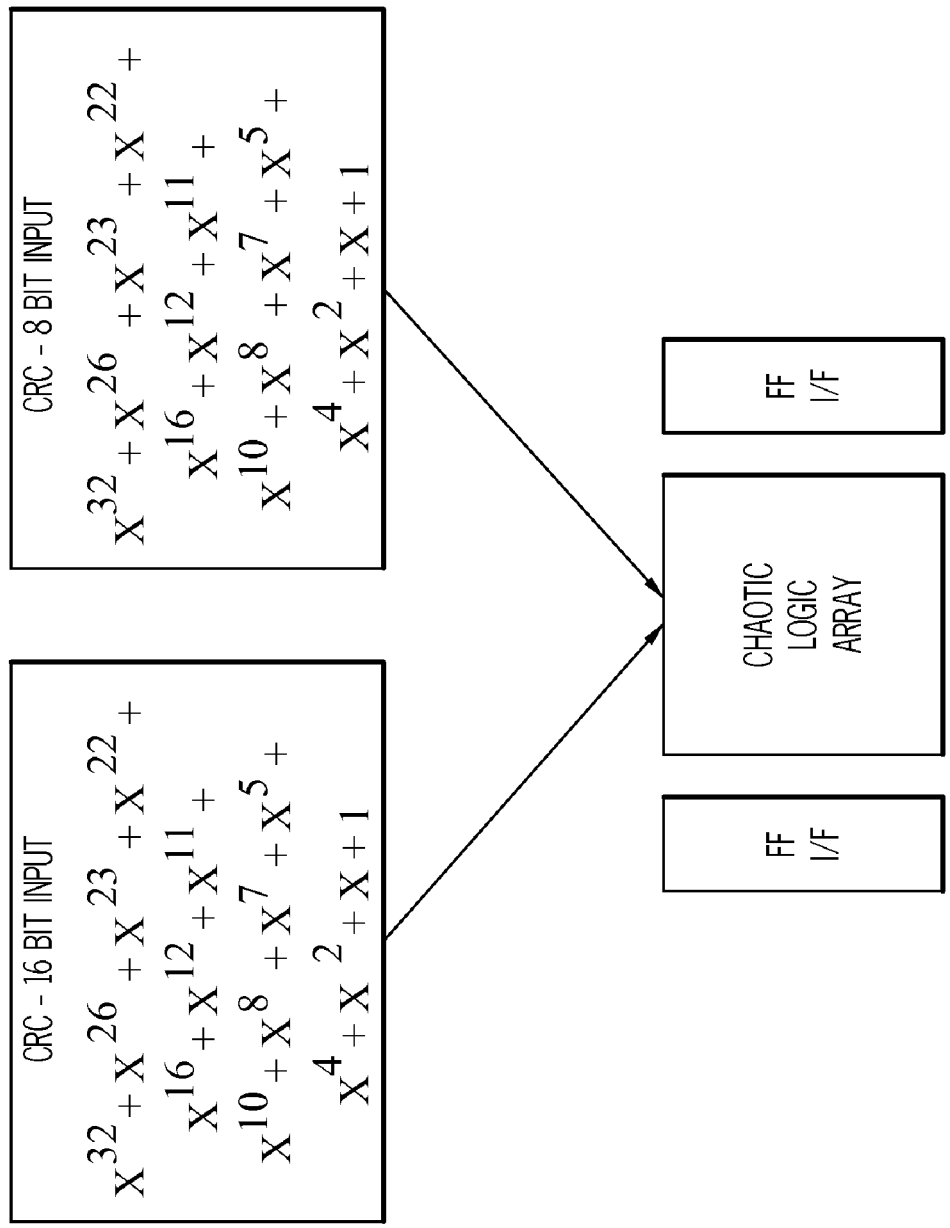
FIG. 17 is a simplified diagram for switching between two different cyclic redundancy check functions using the dynamically configurable logic, according to the present invention.

Another example is a cyclic redundancy check (CRC) calculation switchable between two different CRCs. An n bit cyclical redundancy checking circuit and a m bit cyclical redundancy checking circuit, where n and m are different positive integer numbers e.g., CRCS 4-bit input to CRC 8-bit input. FIG. 17 is a simplified diagram for switching between two different cyclic redundancy check functions using the dynamically configurable logic, according to the present invention. In this embodiment, the CRC is the same polynomial, but the input into the CRC algorithm morphs between 8 bits and 16 bits. The input width changes the logical equation for the CRC. This application is an example of doubling the bandwidth through the CRC using the same circuit. One important aspect of this design of the logic array is to minimize routing differences between the algorithms.

Figure 18:
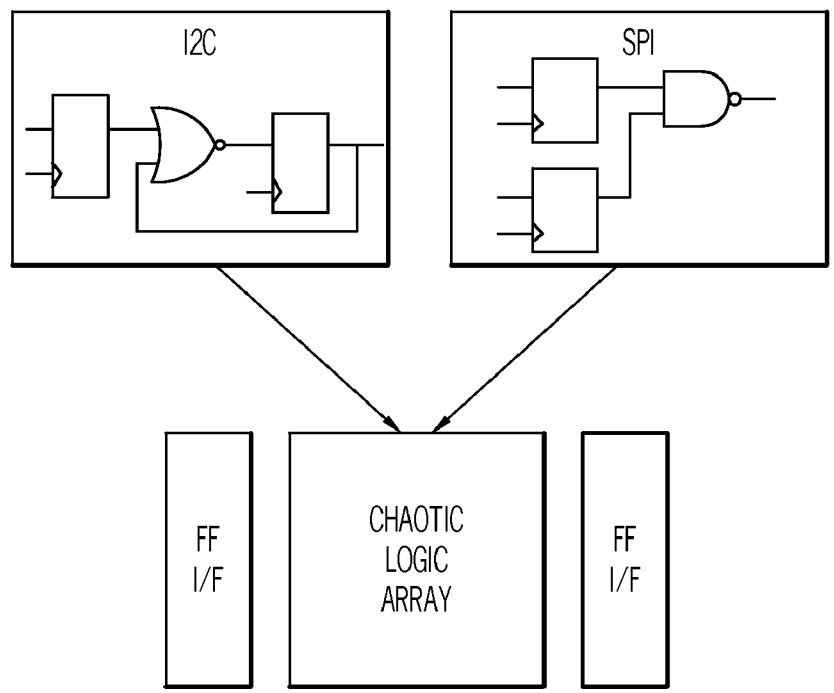
FIG. 18 is a simplified diagram for switching between two communication protocols or decoders with state machine information, according to the present invention.

Another example is a first decoder/encoder and a second decoder/encoder for handling different communications protocols, wherein the first decoder algorithm and the second decoder are different decoders e.g., SPI interface to I2C interface. In this embodiment the two different communication protocols require complex state machines information and data flow. Specifically, in this embodiment, the circuit is able to reconfigure as a SPI (Serial Peripheral Interface) or an I2C (inter IC control) bus implementation. FIG. 18 is a simplified diagram for switching between two communication protocols or decoders with state machine information, according to the present invention.

Figure 19:
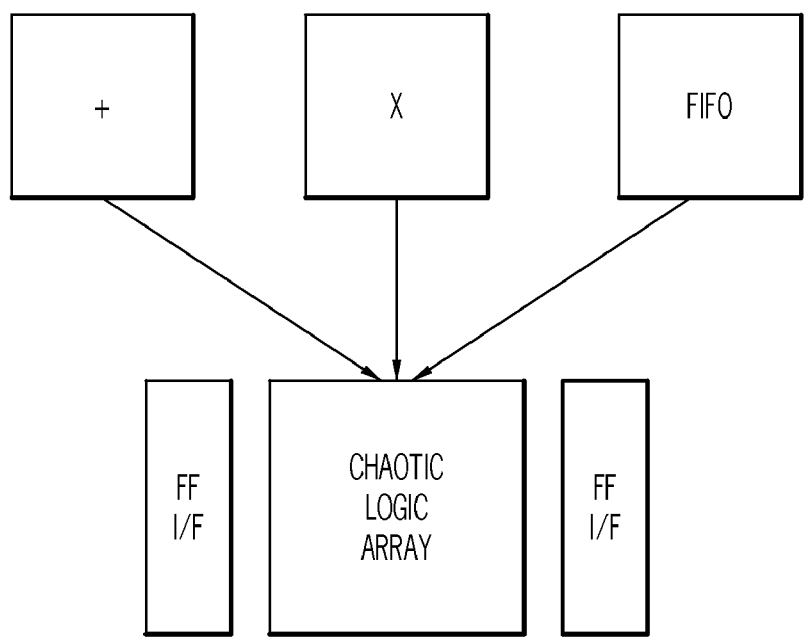
FIG. 19 is a simplified diagram of an arithmetic logic unit (ALU) with three switchable functions, according to the present invention.

Another example is a first arithmetic algorithm and a second arithmetic algorithm, where in the first arithmetic algorithm and the second arithmetic algorithm are different arithmetic algorithms e.g. adder-accumulator to multiplier. FIG. 19 is an simplified diagram of an arithmetic logic unit (ALU) with three switchable functions, according to the present invention. In this embodiment the ALU has three switchable functions, two arithmetic functions (adder, multiplier, divider, barrel shifter, or others) and one function of scratchpad memory. The first FPCGA demonstration implemented a small Arithmetic Logic Unit or ALU. The ALU is able to switch between at least two arithmetic functions and a completely different function such as a small First In First Out or FIFO (FIFOs are used commonly in electronic circuits for buffering and flow control). This experiment takes a significant step toward showing the possibilities for future reconfigurable computing. The three functions are combined into a single logic array controlled through a microcontroller interface. The microcontroller can switch functions, then write data to the interface, and finally read the results back from the interface.

SerDes High Speed Interconnect with Morphable Interface Protocol

In another embodiment, the present invention is used as a Serializer/Deserializer (SerDes). As a bit of a background SerDes are extensively used for high speed interconnect applications such as telecommunications and computing. Technically, SerDes refers solely to the serial to parallel and parallel to serial functions. Broader definitions include additional functions such as error and protocol handling. For the purposes of this overview, SerDes shall refer to the broader definition.

SerDes supports speeds up to 10 GBps, and protocols such as PCI, PCI-E, Infiniband, Serial Rapid IO (SRIO), Ethernet, HyperTransport, SAS (Serial Attached SCSI) and SATA (Serial Advanced Technology Attachment).

SerDes are designed in several functional layers, each with a specific technical function. The Physical Layer, or PHY handles transfer of data bits over a communication channel and can interface to various material including optical, copper, and coaxial cable. The PHY layer does not handle any protocol, but defines system interconnect parameters such as voltage.

The Data Link Layer (DLL) transfers frames of data and inserts framing information to indicate the frame boundaries. It also inserts control information to monitor and handle error conditions. Typically implemented 8b/10b encoding supports DC balance and guarantees data transitions necessary to extract the embedded clock.

The Transaction Link Layer (TLL) transfers data in the form of packets across the communication network. The TLL handles associated protocol for error detection and recovery, and sequence and flow control.

Typical SerDes designs implement a single communication protocol. Incorporating a chaotic element based protocol interface into the SerDes will allow the SerDes to automatically reconfigure its protocol handling function to the current protocol interface. For example, it can be placed into a PCI-Express based system or a Ethernet based system, and automatically reconfigure to either protocol. Thus, a design implemented using the present invention provides a SerDes that is protocol agnostic, and can plug and play into multiple systems with different interface protocols.

NONLIMITING EXAMPLES

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. An array of dynamically configurable logic elements comprising:
    at least one multiplexer to select at least one of a first control signal and a second control signal to produce at least a first array selection control signal therefrom;
    a first dynamically configurable logic element, wherein the first logic element operates as one of a plurality of different logic elements types according to at least the first selection control signal;
    at least a second dynamically configurable logic element, wherein the second logic element operates as one of a plurality of different logic element types according to at least the first selection control signal;
    wherein at least one of a logical expression and a memory latch is implemented by the array of dynamically configurable logic elements altered responsive to first selection control signal; and
    wherein the logical expression implemented by the array of dynamically configurable logic implements logic for at least one pair of functions grouped as a first communication protocol and a second communication protocol, where in the first communication protocol and the second communication protocol are different protocol standards.

2. An array of dynamically configurable logic elements comprising:
    at least one multiplexer to select at least one of a first control signal and a second control signal to produce at least a first array selection control signal therefrom;
    a first dynamically configurable logic element, wherein the first logic element operates as one of a plurality of different logic elements types according to at least the first selection control signal;
    at least a second dynamically configurable logic element, wherein the second logic element operates as one of a plurality of different logic element types according to at least the first selection control signal;
    wherein at least one of a logical expression and a memory latch is implemented by the array of dynamically configurable logic elements altered responsive to first selection control signal; and
    wherein the logical expression implemented by the array of dynamically configurable logic implements logic for at least one pair of functions grouped as a first communication protocol and a second communication protocol, where in the first communication protocol and the second communication protocol are different protocol standards as part of Serializer/Deserializer (SerDes).

3. An array of dynamically configurable logic elements comprising:
    at least one multiplexer to select at least one of a first control signal and a second control signal to produce at least a first array selection control signal therefrom;
    a first dynamically configurable logic element, wherein the first logic element operates as one of a plurality of different logic elements types according to at least the first selection control signal;
    at least a second dynamically configurable logic element, wherein the second logic element operates as one of a plurality of different logic element types according to at least the first selection control signal; and
    wherein at least one of a logical expression and a memory latch is implemented by the array of dynamically configurable logic elements altered responsive to first selection control signal;

wherein the logical expression implemented by the array of dynamically configurable logic implements logic for at least one pair of functions grouped as a first communication protocol and a second communication protocol, where in the first communication protocol and the second communication protocol are different protocol standards as part of Serializer/Deserializer (SerDes) with one or more of the following protocols PCI, PCI-E, Infiniband, Serial Rapid IO (SRIO), Ethernet, HyperTransport, SAS (Serial Attached SCSI) and SATA (Serial Advanced Technology Attachment).

* * * * *

UNITED STATES PATENT AND TRADEMARK OFFICE
CERTIFICATE OF CORRECTION

| | | |
|---|---|---|
| PATENT NO. | : 7,925,814 B2 | Page 1 of 1 |
| APPLICATION NO. | : 12/599206 | |
| DATED | : April 12, 2011 | |
| INVENTOR(S) | : Robert A. Schneiderwind | |

It is certified that error appears in the above-identified patent and that said Letters Patent is hereby corrected as shown below:

Column 3, line 23, replace "hits" with "bits"

Signed and Sealed this
Thirty-first Day of May, 2011

David J. Kappos
*Director of the United States Patent and Trademark Office*